United States Patent
Boesch et al.

(10) Patent No.: US 6,298,244 B1
(45) Date of Patent: *Oct. 2, 2001

(54) DUAL-BAND, DUAL-MODE POWER AMPLIFIER

(75) Inventors: Ronald D. Boesch, Morrisville; Ronald C. Meadows, Youngsville, both of NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/094,515

(22) Filed: Jun. 10, 1998

Related U.S. Application Data (63) Continuation-in-part of application No. 08/888,168, filed on Jul. 3, 1997, and a continuation-in-part of application No. 08/939,870, filed on Sep. 29, 1997.

(51) Int. Cl.[7] ............................... H04B 1/38; H04M 1/00
(52) U.S. Cl. ........................ 455/553; 455/93; 330/295; 330/126; 330/51
(58) Field of Search ..................... 455/91, 93, 188, 455/114, 137, 553, 143, 144, 232.1, 239.1, 241.1; 330/295, 302, 305, 306, 310, 51, 126, 133

(56) References Cited

U.S. PATENT DOCUMENTS

| | | |
|---|---|---|
| 2,247,898 | 7/1941 | Wheeler et al. .................. 333/175 X |
| 3,332,038 | 7/1967 | Stanley et al. ........................ 333/129 |

(List continued on next page.)

FOREIGN PATENT DOCUMENTS

| | | |
|---|---|---|
| 2111616 | 6/1994 | (CA) . |
| 2120679 | 11/1994 | (CA) . |
| 0482502A2 | 4/1992 | (EP) .................................. H03F/3/21 |
| 744831 | 11/1996 | (EP) . |
| 0823751 A2 | 2/1998 | (EP) ............................. H01Q/21/320 |
| 0837559 A1 | 4/1998 | (EP) ................................. H03F/3/72 |
| 55-149518 | 11/1980 | (JP) ....................................... 333/132 |
| 07312523 | 11/1995 | (JP) . |
| 08125450 | 5/1996 | (JP) . |
| WO9710621 | 3/1997 | (WO) . |
| WO 98/47222 | 10/1998 | (WO) .............................. H03F/3/72 |
| WO 99/17445 | 4/1999 | (WO) .............................. H03H/7/46 |

OTHER PUBLICATIONS

Crowhurst, "3–Way Crossover Design", Radio–Electronics, pp. 137–143, Jan. 1957.

Wheeler, et al; "A Solid State Amplifier for Satellite Communications," Microwave Journal, vol. 18, No. 7, Jul. 1975 pp 52–55.

(List continued on next page.)

*Primary Examiner*—Dwayne Bost
*Assistant Examiner*—Charles Craver
(74) *Attorney, Agent, or Firm*—Myers Bigel Sibley & Sajovec

(57) ABSTRACT

A power amplifier circuit has a driver amplifier stage including a low band driver amplifier and a high band driver amplifier. A final amplifier stage includes a linear mode amplifier for amplifying digitally modulated signals and a saturated (nonlinear) mode amplifier for amplifying frequency modulated (analog) signals. A switching network interconnects the driver amplifier stage and the final amplifier stage. Depending on the desired mode of operation, an appropriate driver amplifier can be coupled to an appropriate final amplifier to most effectively and efficiently amplify analog or digital RF signals in either of a plurality of frequency bands. A diplex matching circuit is coupled to the linear mode final amplifier for impedance matching and for separating D-AMPS (800 MHz band) and PCS (1900 MHz band) digital signals. A power impedance matching circuit is coupled to the output of the saturated mode final amplifier.

19 Claims, 4 Drawing Sheets

U.S. PATENT DOCUMENTS

| | | | |
|---|---|---|---|
| 4,085,405 | | 4/1978 | Barlow ................................. 333/129 |
| 5,060,294 | | 10/1991 | Schent et al. ........................... 455/93 |
| 5,155,724 | * | 10/1992 | Edwards ............................... 370/297 |
| 5,175,871 | * | 12/1992 | Kunkel .................................. 455/69 |
| 5,248,979 | | 9/1993 | Orme et al. ............................ 342/58 |
| 5,258,728 | | 11/1993 | Taniyoshi et al. .................... 333/132 |
| 5,347,229 | * | 9/1994 | Suckling et al. ...................... 330/251 |
| 5,392,463 | | 2/1995 | Yamada ................................. 455/93 |
| 5,423,078 | | 6/1995 | Epperson et al. ....................... 455/89 |
| 5,438,684 | * | 8/1995 | Schwent et al. ...................... 455/553 |
| 5,483,209 | | 1/1996 | Takayama . |
| 5,530,923 | * | 6/1996 | Heinonen et al. .................... 455/126 |
| 5,541,554 | * | 7/1996 | Stengel et al. ......................... 330/51 |
| 5,546,051 | | 8/1996 | Koizumi et al. ...................... 330/297 |
| 5,550,895 | * | 8/1996 | Burson et al. ........................ 455/552 |
| 5,640,686 | | 6/1997 | Norimatsu .............................. 455/74 |
| 5,673,287 | | 9/1997 | Colvis et al. ......................... 375/216 |
| 5,774,017 | * | 6/1998 | Adar ...................................... 330/51 |
| 5,884,149 | * | 3/1999 | Jaakola ................................ 455/103 |
| 5,969,582 | * | 10/1999 | Boesch et al. ....................... 333/129 |
| 6,091,966 | * | 7/2000 | Meadows ............................. 455/553 |

OTHER PUBLICATIONS

Hikita, et al; "1.5 GHz SAW Miniature Antenna Duplexer Used in Personal Digital Cellular", IEICE Trans. Electron., vol. E79–C, No. 5, pp 664–670 (May 1996).

International Search Report, International Application No. PCT/IB99/01255.

* cited by examiner

DUAL-BAND, DUAL-MODE POWER AMPLIFIER

RELATED APPLICATIONS

This application is a continuation-in-part of copending U.S. patent application Ser. No. 08/888,168 filed Jul. 3, 1997 and U.S. patent application Ser. No. 08/939,870 filed Sep. 29, 1997, each of which is assigned to the assignee of the present application and each of which is hereby incorporated by reference.

BACKGROUND OF THE INVENTION

1. Field of Invention

The present invention relates generally to power amplifiers and in particular to a dual-band, dual-mode power amplifier.

2. Description of Related Art

In the United States, cellular operating licenses have been awarded by the Federal Communication Commission (FCC) pursuant to a licensing scheme which divides the country into geographic service markets. Cellular licenses were originally granted for radio frequency (RF) blocks in the 800 MHz range. Most 800 MHz cellular telephone systems in the United States utilize the Advanced Mobile Phone Service (AMPS) analog air interface standard. A later generation air interface standard for the 800 MHz band, known as D-AMPS, has subsequently been developed and implemented. The D-AMPS standard comprises both digital and analog cellular communication. Thus, there are presently both analog (AMPS) and digital (D-AMPS) cellular telephone networks in operation at 800 MHz in the United States.

In response to increased demand for cellular services, a number of digital air interface standards were developed for providing efficient digital communication of voice, data, fax and text messages under the umbrella of "personal communications services" or PCS.

Operational PCS systems, such as systems based on the GSM TDMA (Time Division Multiple Access) or IS95 CDMA (Code Division Multiple Access) air interface standards, are being implemented in the United States in the 1900 MHz frequency range. Meanwhile, existing 800 MHz cellular systems are continuing to operate.

Thus, there are presently operating in the United States analog and digital cellular systems at 800 MHz and digital PCS systems at 1900 MHz. Mobile subscribers who desire to receive services from systems operating at 800 MHz and from systems operating at 1900 MHz must either use two different mobile transceivers capable of operating within the cellular or 800 MHz band and the PCS or 1900 MHz band, respectively, or, preferably, use a single "dual-band" mobile transceiver which can receive and transmit RF signals in both frequency bands. Moreover, mobile subscribers who wish to communicate using both analog and digital systems must again either use two different mobile transceivers or, preferably, use a single "dual-mode" transceiver. Ideally, a mobile transceiver is capable of both dual-mode and dual-band operation to provide the user with maximum flexibility and functionality.

A problem arises, however, in that the power amplifier used in a mobile transceiver is typically optimized for use in a particular band (i.e. PCS or AMPS) and in a particular mode (i.e. analog or digital). This problem is manifested in two ways: as an impedance matching problem and as an amplifier biasing problem.

For maximum efficiency, the impedance at the output of the amplifier must be matched to the impedance of a duplexer/diplexer prior to transmission. However, the impedance of the matching circuit is dependent on the frequency of operation. Thus, a conventional matching circuit optimized for matching the impedance of an amplifier at 800 MHz will generally not optimally match the impedance of the same amplifier operating at 1900 MHz. Moreover, the impedance of the amplifier is dependent on the mode of operation. Thus, a conventional matching circuit optimized for matching the impedance of an amplifier operating at 800 MHz in the AMPS mode will not adequately match the impedance of the same amplifier operating at 800 MHz in the D-AMPS digital mode.

The biasing problem arises due to the fact that the efficiency of an amplifier is dependent on the mode or class of operation of the amplifier which is determined by the modulation technique employed. Typically, analog communication systems employ well known frequency modulation (FM) techniques to modulate analog information onto a carrier signal, while digital communication systems employ digital modulation schemes, such as $\pi/4$ DQPSK (Differential Quadrature Phase Shift Keying) modulation. Signals transmitted using frequency modulation are most efficiently amplified by a power amplifier biased and operating in non-linear or saturated mode. Signals transmitted using $\pi/4$ DQPSK modulation, on the other hand, are most efficiently amplified by a power amplifier biased and operating in linear mode.

Figure 1:
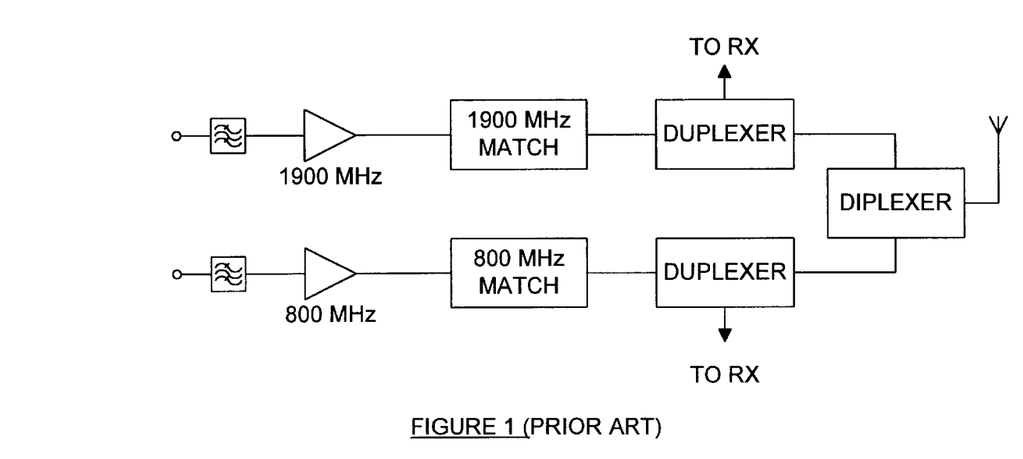
FIG. 1 is a schematic diagram of a dual amplifier chain configuration known in the art.

One possible solution to these problems is to provide a separate amplifier chain for both high-band (1900 MHz) and low-band (800 MHz) operation, as illustrated in FIG. 1. However, this solution is expensive, redundant and wasteful. Moreover, the problem of biasing the low-band amplifier still exists, since the low-band amplifier must amplify both digital and analog signals.

In transceivers having a single amplifier chain, one possible solution to the impedance matching problem is to provide the amplifier with separate, switched high-pass and low-pass matching networks at its output. However, the switch must be capable of handling high power, which tends to require a large, costly switch. Moreover, the match at 800 MHz will necessarily be a blended match, causing a loss of efficiency in the analog mode.

Another solution to the impedance matching problem is to provide a broadband power matching circuit covering both desired frequency bands and having peaks at the transmit bands. Such a configuration would tend to waste bandwidth, however, when the desired match frequencies differ by an octave or more and the desired bandwidth in each band is relatively narrow. Fano's Limit shows that there is a physical limitation on broadband matching when a reactive element (such as the drain-source capacitance of a transistor) is present.

In transceivers having a single amplifier chain, prior art solutions to the impedance matching problem address the biasing problem by providing separate bias levels, although the impedance match remains constant. If a single amplifier is used to amplify both analog and digital signals, the amplifier must be biased to barely meet linearity requirements while retaining as much analog efficiency as possible. Such an arrangement tends to be inefficient. As radiotelephones become smaller and power consumption requirements become stricter, such inefficient operation is highly undesirable.

Therefore, there is a need in the art for a power amplifier circuit capable of efficient operation in both 800 MHz and 1900 MHz systems and in both analog and digital systems. Such a dual-band, dual mode power amplifier preferably provides an integrated, efficient solution to the problems described above.

SUMMARY OF THE INVENTION

It is therefore an object of the present invention to provide a power amplifier circuit for a radio transceiver capable of efficiently amplifying RF signals in a linear or saturated mode of operation.

It is a further object of the present invention to provide a power amplifier circuit for efficiently amplifying RF signals in a plurality of frequency bands or ranges.

It is a further object of the present invention to provide a dual-band, dual-mode power amplifier circuit that may be selectably placed in a linear mode of operation for amplifying DQPSK modulated signals and a saturated mode of operation for amplifying frequency modulated signals.

The foregoing and other objects are accomplished in a power amplifier circuit having a driver amplifier stage including a low band driver amplifier and a high band driver amplifier. A final amplifier stage includes a linear mode amplifier for amplifying digitally modulated signals and a saturated (nonlinear) mode amplifier for amplifying frequency modulated (analog) signals. A switching network interconnects the driver amplifier stage and the final amplifier stage. Depending on the desired mode of operation, an appropriate driver amplifier can be coupled to an appropriate final amplifier to most effectively and efficiently amplify analog or digital RF signals in either of a plurality of frequency bands.

A diplex matching circuit is coupled to the linear mode final amplifier for impedance matching and for separating D-AMPS (800 MHz band) and PCS (1900 MHz band) digital signals. A power impedance matching circuit is coupled to the output of the saturated mode final amplifier.

The amplifier circuit includes means for selectably placing the amplifier circuit in a linear mode or a saturated mode, corresponding to digital and analog modes of operation of the radiotelephone, respectively. In the linear or digital mode, the linear final amplifier is biased in the on state and the saturated mode amplifier may be biased in the off state. Similarly, in the saturated or analog mode of operation, the saturated mode final amplifier is biased in the on state and the linear amplifier may be biased in the off state.

The amplifier circuit may include means for selectably coupling either the first diplex matching circuit output or the low pass matching circuit output to an output line when the amplifier circuit is selectably placed in linear mode or saturated mode, respectively.

These and other objects of the invention, together with features and advantages thereof will become apparent from the following detailed specification when read with the accompanying drawings in which like reference numerals refer to like elements.

DETAILED DESCRIPTION OF THE PREFERRED EMBODIMENTS

The present invention will now be described with reference to the accompanying drawings, in which preferred embodiments of the invention are shown. However, this invention may be embodied in many different forms and should not be construed as limited to the specific embodiments shown. Rather, the preferred embodiments are provided so that this disclosure is thorough and complete, and will fully convey the scope of the invention to those skilled in the art.

In this application, the terms "duplexer" and "diplexer" both refer to a three port, frequency selective splitter. A duplexer is used to enable an RF transceiver to simultaneously transmit and receive on nearly adjacent frequencies using a common antenna, whereas a diplexer separates input signals into high band or low band signals.

Figure 2:
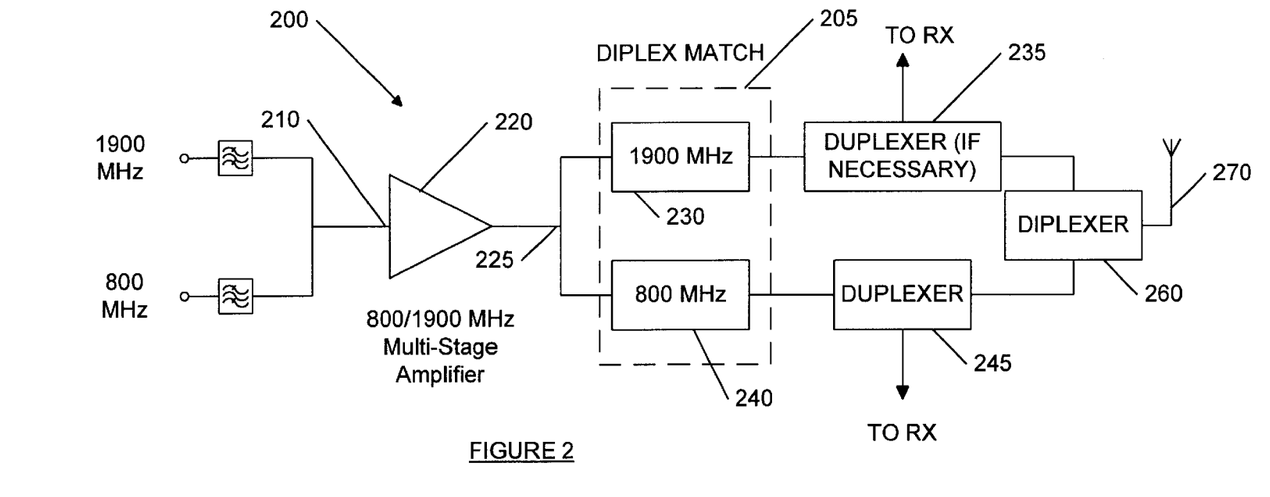
FIG. 2 is a schematic diagram of a single amplifier chain with diplex power matching circuit for dual band operation.

Referring first to FIG. 2, a dual-band power amplifier circuit is indicated generally by reference numeral 200. Power amplifier circuit 200 has a diplex matching circuit 205 for matching the impedance of a multi-band power amplifier. Radio Frequency (RF) signals are input to a multi-band amplifier 220 at RF input port 210. Amplifier 220 amplifies the RF signals and outputs the amplified RF signals to a diplex power matching circuit 205 at port 225.

In the embodiment shown in FIG. 2, the amplified RF signals may fall into one of two frequency bands. However, it will be readily apparent to one skilled in the art that the a present invention could modified for use in connection with a power amplifier capable of amplifying RF signals contained in more than two frequency bands.

RF signals falling in the first frequency band will be passed by filter/match circuit 230 to duplexer 235. Likewise, RF signals falling in the second frequency band will be passed by filter/match circuit 240 to duplexer 245.

Filter/match circuit 230 blocks RF signals in the second frequency band while providing a suitable impedance match for signals in the first frequency band. Likewise, filter/match circuit 240 blocks RF signals in the first frequency band while providing a suitable impedance match for signals in the second frequency band.

RF signals passed by filter/match circuit 230 are passed through duplexer 235 (if necessary) and into diplexer 260 for transmission using antenna 270. Depending on the communication system in which the amplifier 200 is being used and whether full duplex operation at 1900 MHz is required, duplexer 235 may or may not be necessary. RF signals passed by filter/match circuit 240 are passed through duplexer 245 and into diplexer 260 for transmission using antenna 270.

The embodiment illustrated in FIG. 2 and implementations thereof are described in greater detail in copending U.S. patent application Ser. No. 08/888,168.

Figure 3:
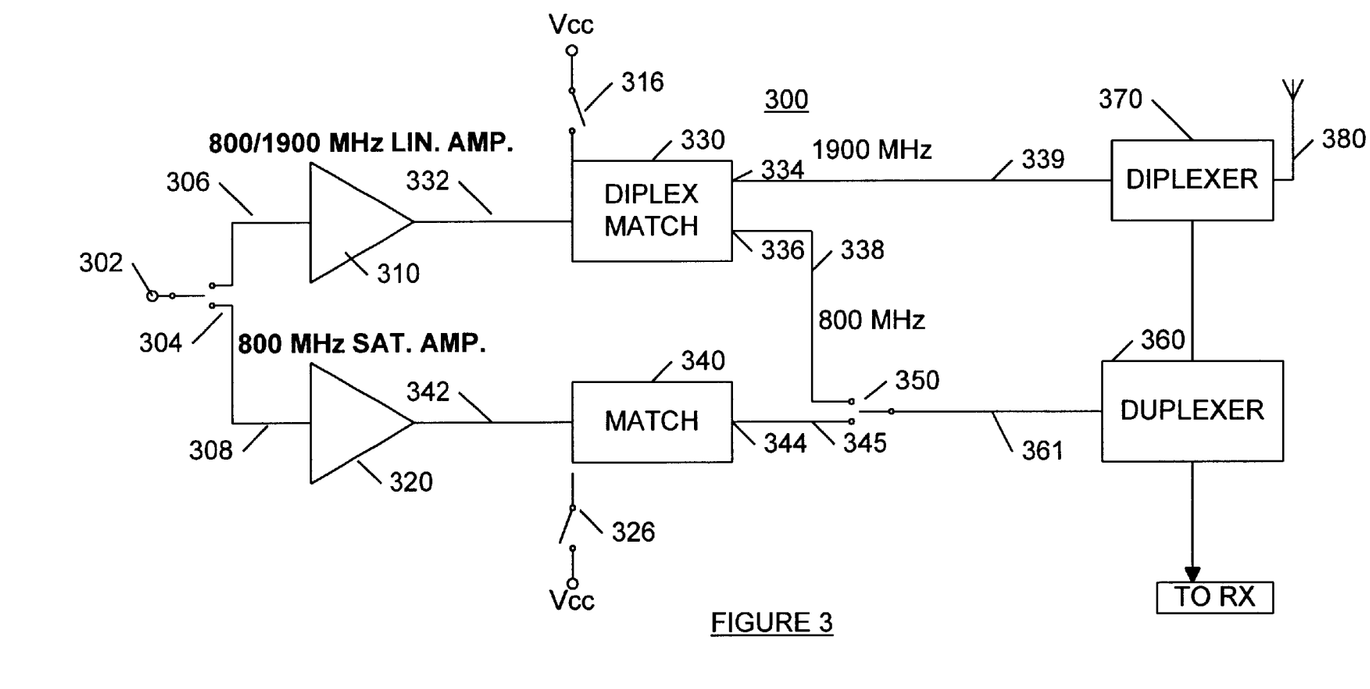
FIG. 3 is a schematic diagram of a dual band, dual mode amplifier chain.

Referring now to FIG. 3, a dual-mode, dual-band amplifier circuit is indicated generally by reference numeral 300. Amplifier circuit 300 is advantageously included in the transmitter or transceiver of a radiotelephone (not shown) for amplifying both analog and digital signals in two different frequency bands or ranges, thereby providing the radiotelephone with dual-band, dual-mode functionality. Amplifier circuit 300 includes an RF input port 302 which is coupled to a mode select switch 304. Depending on whether the radiotelephone is being operated in a digital or analog mode, the setting of mode select switch 304 will cause input RF signals to be transmitted down digital path 306 or analog path 308, respectively. The position of mode select switch 304 is controlled by a mode control signal from a microprocessor (not shown) within the radiotelephone. The control signal provided by the microprocessor is used to selectively place amplifier circuit 300 in a linear mode or a saturated (nonlinear) mode of operation.

Digital path 306 includes a linear amplifier 310, which efficiently amplifies signals which have been modulated using a linear modulation technique such as DQPSK modulation. The output of linear amplifier 310 is coupled to a diplex matching circuit 330 which efficiently separates 1900 MHz signals from 800 MHz signals while providing an impedance match for linear amplifier 310 in both frequency ranges. The structure and function of diplex matching circuit 330 is described in greater detail below.

Diplex matching circuit 330 has a 1900 MHz output 334 and an 800 MHz output 336. The 1900 MHz output is coupled via path 339 to a diplexer 370, which couples the 1900 MHz output signal to an antenna 380. Additionally, a duplexer may be provided between the 1900 MHz output 334 and diplexer 370 if full duplex operation is desired for 1900 MHz operation, for example in a CDMA or multirate TDMA system.

Analog path 308 includes a nonlinear amplifier 320 which efficiently amplifies frequency modulated signals. The output of nonlinear amplifier 320 is coupled to a matching circuit 340 which provides a 50-Ohm impedance match for nonlinear amplifier 320. Matching circuit 340 also helps suppress harmonic content that could feed back down the 1900 MHz path 339.

Since separate linear and nonlinear amplifiers 310, 320, respectively are provided, the nonlinear amplifier may be operated as a deeply saturated Class C amplifier or as a switched mode class E amplifier. Previous solutions in which a single amplifier was used for both linear and nonlinear amplification required that the amplifier be biased (in Class AB) to barely meet linearity requirements while retaining as much nonlinear efficiency as possible. The result was a blended match that was not optimal for either linear or nonlinear amplification. The present invention overcomes this limitation while providing an amplifier circuit that can effectively and efficiently amplify signals in different frequency bands.

The output of matching circuit 340 on line 345 and the 800 MHz output of diplex matching circuit 330 on line 338 are provided to a high power switch 350. High power switch 350 couples either the 800 MHz output of diplex match circuit 330 (corresponding to a digital 800 MHz signal) or the output of matching circuit 340 (corresponding to an analog 800 MHz signal) to duplexer 360 via output line 361, depending on whether the cellular telephone is being operated in a digital or analog mode, respectively. As with mode select switch 304, high power switch 350 is controlled by the mode control signal from the radiotelephone's microprocessor. Additionally, high power switch 350 provides isolation for linear amplifier 310, thus preventing linear amplifier 310 from being loaded by nonlinear amplifier 320 and matching circuit 340.

DC biasing for linear amplifier 310 and nonlinear amplifier 320 is provided by switching Vcc inputs 316, 326 on or off depending on the desired mode of operation of the cellular telephone (i.e. digital or analog).

Duplexer 360 is a conventional duplexer designed to permit full duplex operation at 800 MHz. Duplexer 360 couples 800 MHz signals to diplexer 370, which in turn couples the signals to antenna 380 for transmission.

The embodiment illustrated in FIG. 3 is particularly suited for use in a TDMA transceiver, which operates at half duplex at 1900 MHz. However, as described above, the circuit can be easily adapted for use in a CDMA or multirate TDMA transceiver by providing an additional duplexer in path 339 to permit full duplex operation at 1900 MHz.

Diplex matching circuit 330, which is essentially the same circuit as diplex matching circuit 205 shown in FIG. 2, is described in detail in copending U.S. application Ser. No. 08/888,168 and will not be discussed further. The embodiment illustrated in FIG. 3 and implementations thereof are described in greater detail in copending U.S. patent application Ser. No. 08/939,870.

Figure 4:
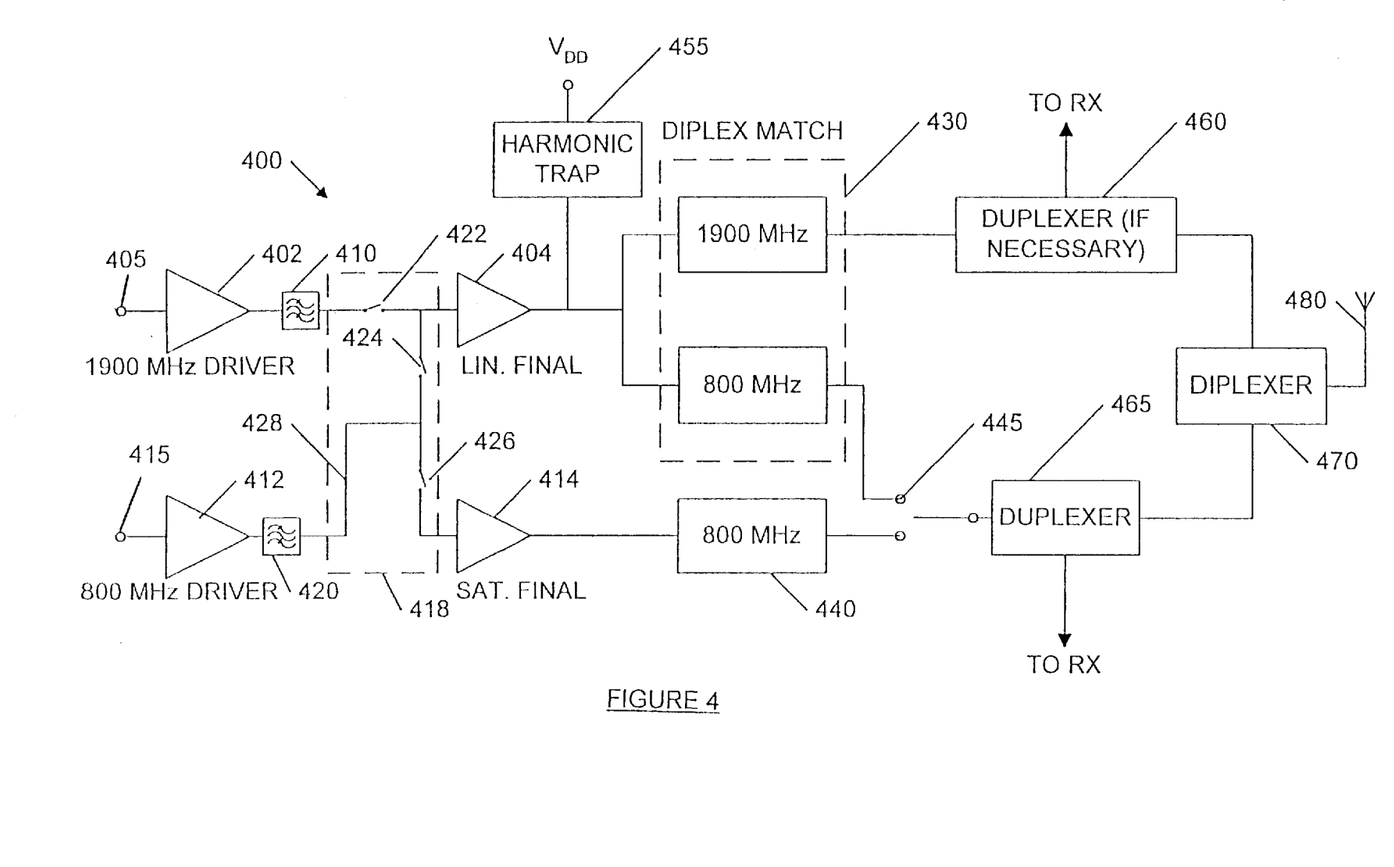
FIG. 4 is a schematic diagram of another embodiment of a dual band, dual mode amplifier chain.

Referring now to FIG. 4, a second dual-band dual-mode amplifier architecture is indicated generally as 400. Amplifier 400 improves on the designs illustrated in FIGS. 2 and 3 by separating the amplifier into a driver stage and a final stage, and selectively coupling the appropriate driver and final stages depending on the desired mode of operation of the amplifier 400. Amplifier 400 includes a 1900 MHz driver amplifier 402 tuned and biased to efficiently amplify signals in the 1900 MHz frequency band and an 800 MHz driver amplifier 412 tuned and biased to efficiently amplify signals in the 800 MHz frequency band.

Amplifier 400 also includes a pair of final stage amplifiers 404 and 414. Final stage amplifier 404 is biased and tuned for linear operation as a class AB amplifier to efficiently amplify digitally modulated RF signals, while final stage amplifier 414 is biased and tuned for saturated operation in an efficient mode of operation, such as a deeply saturated class C amplifier or a switched mode class E amplifier or some other highly efficient mode of operation to efficiently amplify frequency modulated analog RF signals.

The driver stage amplifiers 402, 412 are connected to the final stage amplifiers 404, 414 by means of a switching network 418 which includes switches 422, 424 and 426. Each of switches 422, 424 and 426 may be a field-effect transistor (FET) switch whose design is well known to those skilled in the art. Other suitable types of switches may be substituted by those having skill in the art. The open/closed state of switches 422, 424 and 426 is controllable by means of control lines (not shown) from an associated microprocessor or other control logic (not shown).

Switch 422 couples the output of 1900 MHz driver amplifier 402 to the input of linear final amplifier 404. The output of 800 MHz driver amplifier 412 is coupled to node 428. Node 428 is in turn coupled to the input of linear final amplifier 404 via switch 424 and to the input of saturated final amplifier 414 via switch 426.

The signal output by final amplifier 404 is passed through diplex matching circuit 430 which filters and passes the signal to duplexer 460 (if necessary) or duplexer 465 (via switch 445) depending on the frequency content of the signal.

In one embodiment, a first filter 410 is provided between the output of 1900 MHz driver amplifier 402 and switch 422, and a second filter 420 is provided between the output of 800 MHz driver amplifier 412 and node 428. These filters 410, 420 filter the input signals prior to the final gain stage thereby providing receive band noise rejection and reduction of the harmonic content of the signal. In one embodiment, Filters 410, 420 are surface acoustic wave (SAW) bandpass filters, the design of which is well known in the art.

By providing a filtered signal to the final amplifier stage, final amplification by the linear amplifier is more effective.

Placing filters between the gain stages of the amplifier allows the duplexers 460, 465 to be implemented with one less pole, decreasing the insertion loss of the overall amplifier circuit 400 and resulting in lower dc current drain. Because of the lower insertion loss of amplifier 400, the final amplifier stage does not need to develop as much output RF power. This has a number of desirable consequences, including a smaller die size and lower dc current consumption.

Figure 5:
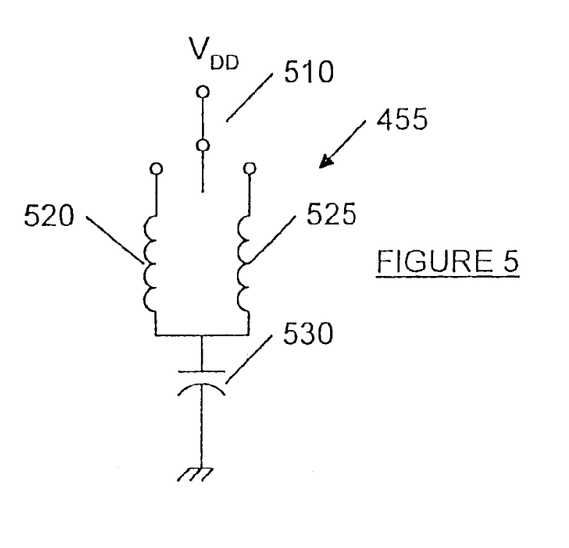
FIG. 5 is a circuit diagram of a harmonic trap for use with the embodiment of FIG. 4.

In one embodiment, a harmonic trap 455 is coupled to the input of diplex matching circuit 430. The function of harmonic trap 455 is to reduce the harmonic content of signals output by diplex matching circuit 430 and to supply VDD to final stage amplifier 404. An embodiment of harmonic trap 455 is shown in FIG. 5. FIG. 5 shows an embodiment of harmonic trap 455, which includes a high-power switch 510 coupled to a pair of parallel switchable inductors 520, 525.

Inductors 520, 525 are in turn coupled to capacitor 530, which is coupled to the input of diplex matching circuit 430. Inductor 520 and capacitor 530 combine to form a parallel resonant circuit that is resonant at 800 MHz, while inductor 525 and capacitor combine to form a parallel resonant circuit that is resonant at 1900 MHz. Thus, depending on the state of switch 510 (which is set according to the operating state of amplifier 400), the harmonic trap 455 will operate to attenuate harmonic signals in the 800 MHz band or the 1900 MHz band. As with switches 422, 424 and 426, switch 510 is controllable by means of control lines (not shown) from an associated microprocessor or other control logic (not shown).

Since the linear final amplifier 404 is operated in a class AB mode, harmonic content of the output signal is higher than it would be using a class A amplifier. Providing a harmonic trap at the output of final amplifier 404 therefore increases the efficiency of final amplifier 404 by constraining the output energy to the desired frequencies.

Referring again to FIG. 4, the amplifier may be operated in one of a number of selectable modes to amplify analog or digital signals in the 800 MHz frequency band or digital signals in the 1900 MHz frequency band. For the 1900 MHz mode of operation, switch 422 is closed, while switch 424 is open. Additionally, in the 1900 MHz mode of operation switch 426 may be open to provide additional isolation of the final stage amplifiers 404, 414. Digitally modulated input signals in the 1900 MHz frequency band are input to amplifier 400 via input terminal 405 and provided to 1900 MHz driver amplifier 402. The signal output by 1900 MHz driver amplifier 402 is coupled to the input of final amplifier 404 which, as noted above, is biased for operation in linear mode. Amplifier 404 efficiently amplifies the digitally modulated signal and outputs the amplified signal to diplex matching circuit 430.

To amplify analog RF signals in the 800 MHz band, (800 MHz analog mode) switches 422 and 424 are open, while switch 426 is closed. Frequency modulated (i.e. analog or FM) input signals in the 800 MHz frequency band are input to amplifier 400 via input terminal 415 and provided to 800 MHz driver amplifier 412. The signal output by 800 MHz driver amplifier 412 is coupled to the input of final amplifier 414 via closed switch 426. Final amplifier 414 is biased for operation in saturated mode, and therefore efficiently amplifies the FM signal and outputs the amplified signal to matching circuit 440.

To amplify digitally-modulated (e.g. π/4 DQPSK) RF signals in the 800 MHz band, (800 MHz digital mode) switches 422 and 426 are open, while switch 424 is closed. Digitally modulated input signals in the 800 MHz frequency band are input to amplifier 400 via input terminal 415 and provided to 800 MHz driver amplifier 412. The signal output by 800 MHz driver amplifier 412 is coupled to the input of final amplifier 404 via node 428 and switch 426. As noted above, final amplifier 404 is biased for operation in linear mode. Amplifier 404 efficiently amplifies the digitally modulated signal and outputs the amplified signal to diplex matching circuit 430. The operation of switch 445 is similar to that of switch 350 described in reference to FIG. 3.

While the present invention has been described with respect to its preferred embodiment, those skilled in the art will recognize that the present invention is not limited to the specific embodiment described and illustrated herein. Different embodiments and adaptations besides those shown herein and described as well as many variations, modifications and equivalent arrangements will now be apparent or will be reasonably suggested by the foregoing specification and drawings, without departing from the substance or scope of the invention. Accordingly, it is intended that the invention be limited only by the spirit and scope of the claims appended hereto.

What is claimed is:

1. A power amplifier circuit for amplifying RF signals, said power amplifier circuit selectively operable in a linear mode or a nonlinear mode and selectively operable to amplify RF signals in a first frequency band or a second frequency band, comprising:
    a first driver amplifier for amplifying RF signals in a first frequency band;
    first and second final amplifiers;
    a diplex matching circuit coupled to said first final amplifier; and
    a switching network coupled between said first driver amplifier and said first and second final amplifiers wherein the switching network selectively couples said first driver amplifier to said first and second final amplifiers in response to said amplifier circuit being placed in a linear or nonlinear mode of operation, respectively;
    a low pass matching circuit coupled to an output of said second final amplifier; and
    switching circuitry, coupled to a first output of said diplex matching circuit and an output of said low pass matching circuit, for selectively coupling said first diplex matching circuit output or said low pass matching circuit output to an output line when said amplifier circuit is selectively placed in linear mode or nonlinear mode, respectively.

2. A power amplifier circuit as recited in claim 1, further comprising:
    a second driver amplifier for amplifying RF signals in a second frequency band; and
    wherein said switching network includes a first switch coupled between said first driver amplifier and said first final amplifier.

3. A power amplifier circuit as recited in claim 2, wherein said switching network further includes a node coupled to an output of said second driver amplifier, a second switch coupled between said node and an input of said first final amplifier and a third switch coupled between said node and an input of said second final amplifier.

4. A power amplifier circuit as recited in claim 3, further comprising a first filter disposed between the output of said first driver amplifier and said first switch, and a second filter disposed between said second driver amplifier and said node.

5. A power amplifier as recited in claim 4, where in said first and second filters are surface acoustic wave filters.

6. A power amplifier as recited in claim 2, further comprising a harmonic trap coupled to an output of said first final amplifier.

7. A power amplifier circuit for amplifying RF signals, said power amplifier circuit selectively operable in a linear mode or a nonlinear mode and selectively operable to amplify RF signals in a first frequency band or a second frequency band, comprising:
- a first driver amplifier for amplifying RF signals in a first frequency band;
- first and second final amplifiers;
- a diplex matching circuit coupled to said first final amplifier;
- a switching network for selectively coupling said first driver amplifier to said first and second final amplifiers in response to said amplifier circuit being placed in a linear or nonlinear mode of operation, respectively;
- a low pass matching circuit coupled to an output of said second final amplifier; and
- switching circuitry, coupled to a first output of said diplex matching circuit and an output of said low pass matching circuit, for selectively coupling said first diplex matching circuit output or said low pass matching circuit output to an output line when said amplifier circuit is selectively placed in linear mode or nonlinear mode, respectively.

8. A power amplifier circuit for amplifying RF signals, said power amplifier circuit selectively operable in a linear mode or a nonlinear mode and selectively operable to amplify RF signals in a first frequency band or a second frequency band, comprising:
- a driver amplifier stage having a high band output and a low band output;
- a final amplifier stage having a linear amplifier and a nonlinear amplifier; and a switching network having more than one switch between the driver amplifier stage and the final amplifier stage for coupling the low band output to one of the linear and nonlinear amplifiers responsive to a mode selection so that the low band output is coupled to the linear amplifier during low band operations in the linear mode and so that the low band output is coupled to the nonlinear amplifier during low band operations in the nonlinear mode.

9. A power amplifier circuit as recited in claim 8, further comprising:
- a filter stage interposed between said driver stage and said switching network.

10. A method for operating a power amplifier selectively operable in a linear mode or a nonlinear mode and selectively operable to amplify RF signals in a first frequency band or a second frequency band, the method comprising:
- amplifying RF signals in the first frequency band;
- selectively coupling the RF signals in the first frequency band to one of a first final amplifier or a second final amplifier in response to the power amplifier being placed in linear or nonlinear mode of operation, respectively;
- generating a first diplex output for RF signals amplified by the first final amplifier corresponding to the first frequency band,
- generating a second diplex output for RF signals amplified by the first final amplifier corresponding to the second frequency band;
- low pass filtering an output of the second final amplifier; and
- selectively coupling one of the first diplex output or the low pass filtered output of the second final amplifier to an output line when the amplifier is selectively placed in a linear mode or nonlinear mode respectively.

11. A method according to claim 10 further comprising:
amplifying RF signals in the second frequency band; and
selectively coupling the amplified RF signals in the second frequency band to the first final amplifier when operating in the second frequency band.

12. A power amplifier for amplifying RF signals, the power amplifier being selectively operable in a linear mode or a nonlinear mode and selectively operable to amplify RF signals in a first frequency band or a second frequency band, comprising:
- a first driver amplifier that amplifies RF signals in the first frequency band to generate amplified RF signals in the first frequency band;
- a second driver amplifier that amplifies RF signals in the second frequency band to generate amplified RF signals in the second frequency band;
- a first final amplifier;
- a second final amplifier;
- a switching network coupled between the first and second driver amplifiers and the first and second final amplifiers wherein the switching network selectively couples one of the driver amplifiers to one of the final amplifiers, wherein the switching network couples the amplified RF signals in the first frequency band to the first final amplifier when transmitting in the first frequency band during linear mode operations and to the second final amplifier when transmitting in the first frequency band during nonlinear mode operations;
- a diplex matching circuit coupled to an output of the first final amplifier wherein the diplex matching circuit generates a first diplex output at a first diplex node when transmitting in the first frequency band and wherein the diplex matching circuit generates a second diplex output at a second diplex node when transmitting in the second frequency band; and
- a switch that selectively couples one of the first diplex output and an output of the second final amplifier to an output line when transmitting in the first frequency band.

13. A power amplifier according to claim 12 wherein the switching network couples the amplified RF signals in the first frequency band to the first final amplifier when transmitting in the first frequency band during linear mode operations and to the second final amplifier when transmitting in the first frequency band during nonlinear mode operations.

14. A power amplifier according to claim 12 wherein the switching network couples the amplified RF signals in the second frequency band to the first final amplifier when transmitting in the second frequency band.

15. A power amplifier according to claim 12 further comprising:
- a low pass filter coupled between the second final amplifier and the switch wherein the low pass filter passes the first frequency band and blocks the second frequency band.

16. A method for operating a power amplifier selectively operable in a linear mode or a nonlinear mode and selectively operable to amplify RF signals in a first frequency band or a second frequency band, the method comprising:
  generating amplified RF signals in the first frequency band when transmitting in the first frequency band;
  generating amplified RF signals in the second frequency band when transmitting in the second frequency band;
  coupling the amplified RF signals in the first frequency band to a first final amplifier when transmitting in the first frequency band and operating in the linear mode;
  coupling the amplified RF signals in the first frequency band to a second final amplifier when transmitting in the first frequency band and operating in the nonlinear mode; and
  coupling the amplified RF signals in the second frequency band to the first final amplifier when transmitting in the second frequency band.

17. A method according to claim 16 further comprising:
  generating a first diplex output from the first final amplifier when transmitting in the first frequency band when operating in the linear mode; and
  generating a second diplex output from the first final amplifier when transmitting in the second frequency band when operating in the linear mode.

18. A method according to claim 17 further comprising:
  selectively coupling one of the first diplex output and an output of the second final amplifier to an output line when transmitting in the first frequency band.

19. A method according to claim 18 further comprising:
  low pass filtering the output of the second final amplifier before selectively coupling one of the first diplex output and the output of the second final amplifier to pass the first frequency band and to block the second frequency band.

* * * * *